(12) United States Patent
Horiuchi

(10) Patent No.: US 7,193,888 B2
(45) Date of Patent: Mar. 20, 2007

(54) NONVOLATILE MEMORY CIRCUIT BASED ON CHANGE IN MIS TRANSISTOR CHARACTERISTICS

(75) Inventor: Tadahiko Horiuchi, Isehara (JP)

(73) Assignee: Nscore Inc., Fukuoka (JP)

( * ) Notice: Subject to any disclaimer, the term of this patent is extended or adjusted under 35 U.S.C. 154(b) by 0 days.

(21) Appl. No.: 11/180,132

(22) Filed: Jul. 13, 2005

(65) Prior Publication Data

US 2007/0014145 A1    Jan. 18, 2007

(51) Int. Cl.
*G11C 11/00* (2006.01)
(52) U.S. Cl. ...................... 365/154; 365/182
(58) Field of Classification Search ................ 365/154, 365/182, 185.08
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,956,269 A | 9/1999 | Ouyang et al. | |
| 6,038,168 A | 3/2000 | Allen et al. | |
| 6,906,953 B2 | 6/2005 | Forbes | |
| 6,906,962 B2 | 6/2005 | Layman et al. | |
| 6,909,635 B2 | 6/2005 | Forbes et al. | |
| 2005/0232009 A1* | 10/2005 | Nakamura | 365/185.08 |

FOREIGN PATENT DOCUMENTS

| | | |
|---|---|---|
| JP | 06 076582 | 3/1994 |
| WO | WO 2004 057621 | 7/2004 |

* cited by examiner

*Primary Examiner*—Hoai V. Ho
(74) *Attorney, Agent, or Firm*—Ladas & Parry LLP

(57) ABSTRACT

A memory circuit includes a latch having a first node and a second node, a plate line, a word selecting line, a first MIS transistor having source/drain nodes thereof coupled to the first node and the plate line, respectively, and a gate node thereof coupled to the word selecting line, a second MIS transistor having source/drain nodes thereof coupled to the second node and the plate line, respectively, and a gate node thereof coupled to the word selecting line, and a driver configured to set the plate line to a first potential causing a current to flow in a first direction through the first MIS transistor in a first operation mode and to a second potential causing a current to flow in a second direction through the first MIS transistor in a second operation mode, the first operation mode causing a lingering change in characteristics of the first MIS transistor.

18 Claims, 10 Drawing Sheets

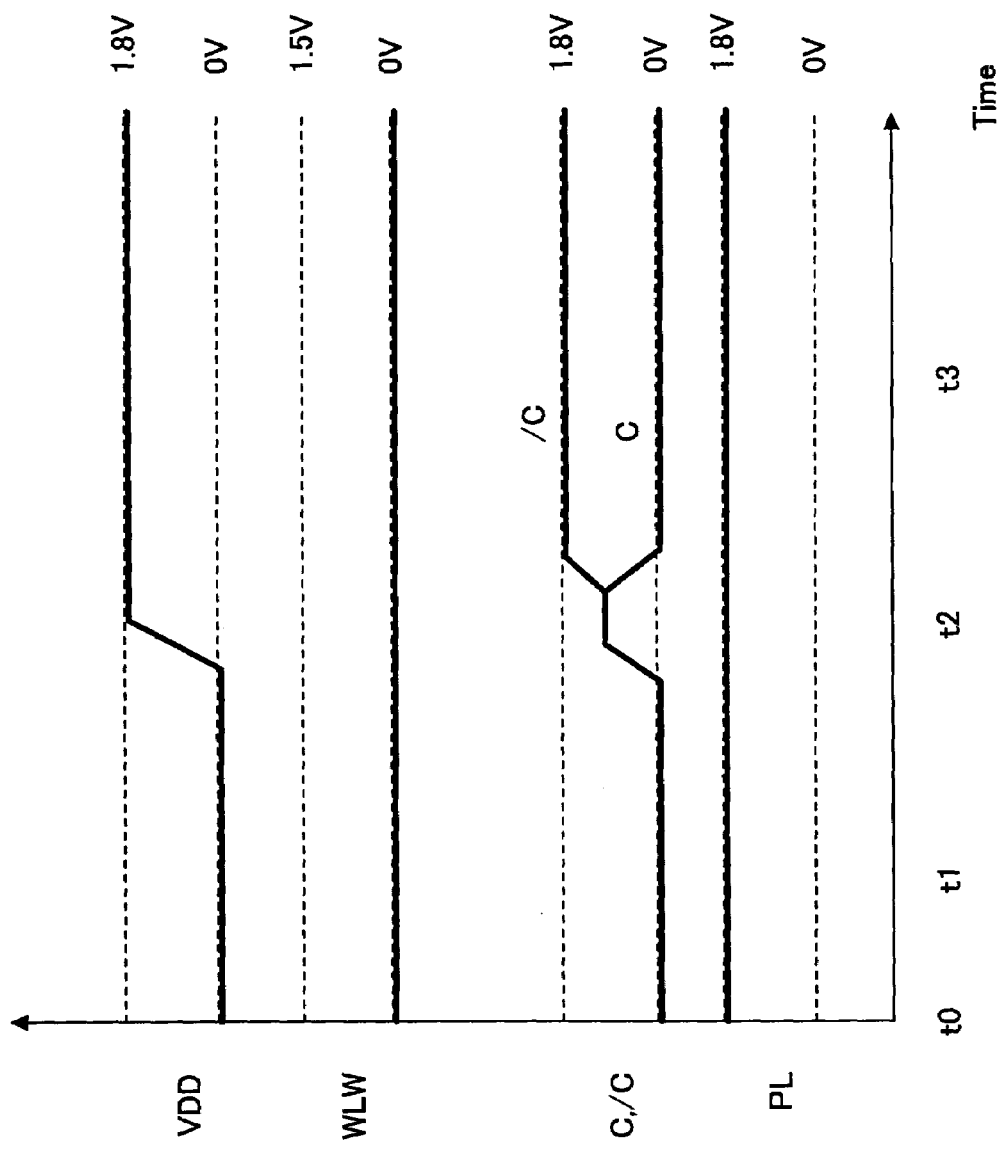

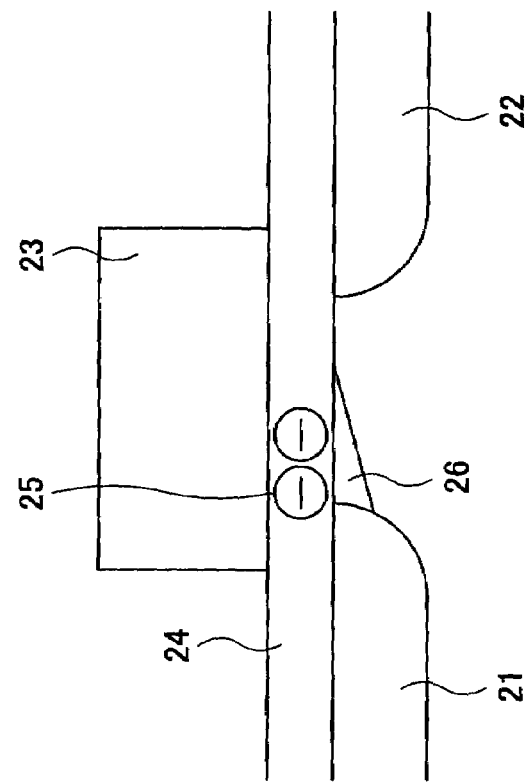
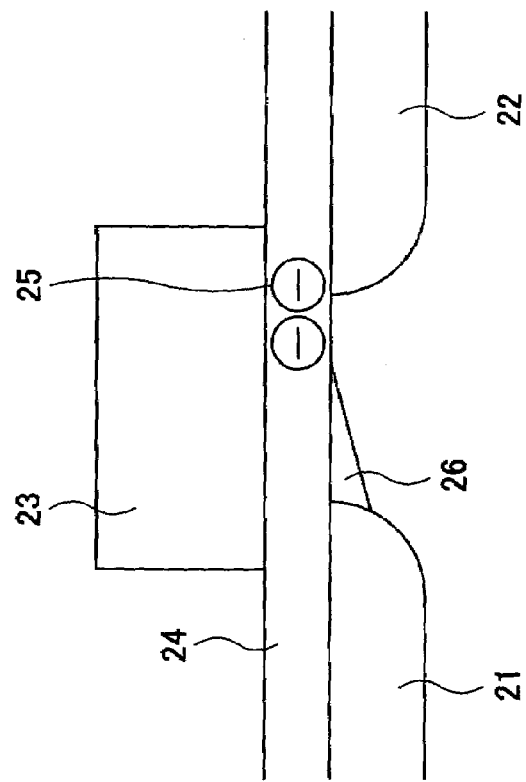

NONVOLATILE MEMORY CIRCUIT BASED ON CHANGE IN MIS TRANSISTOR CHARACTERISTICS

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, include flash EEPROMs employing a floating gate structure, FeRAMs employing a ferroelectric film, MRAMs employing a ferromagnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/016143, which was filed on Dec. 17, 2003, the entire contents of which are hereby incorporated by reference, discloses a memory cell (i.e., a basic unit of data storage) comprised of a pair of transistors which are configured to experience a hot-carrier effect on purpose for storage of one-bit data. A difference in the transistor characteristics caused by the hot-carrier effect represents one-bit data "0" or "1".

Specifically, when one of the two transistors is subjected to a hot-carrier effect, a difference in the ON current develops between the two transistors. The difference in the ON current may be detected by a one-bit static memory circuit (latch) coupled to the transistor pair.

A hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are reversed and used as a drain node and a source node, respectively, at the time of detecting a drain current, the detected drain current exhibits a significant drop caused by the hot-carrier effect. The difference in the detected drain current between these two scenarios is approximately a factor of 10.

Such asymmetric characteristic of a hot-carrier effect, when properly used, may serve to enhance the data write speed of the nonvolatile semiconductor memory device utilizing a hot-carrier effect.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a hot-carrier-effect-based nonvolatile semiconductor memory device that utilizes the asymmetric characteristic of a hot-carrier effect for the purpose of enhancing data-write speed.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a memory circuit, which includes a latch having a first node and a second node configured to be bi-stable with a potential of the first node inverse to a potential of the second node, a plate line, a word selecting line, a first MIS transistor having one of source/drain nodes thereof coupled to the first node of the latch, another one of the source/drain nodes thereof coupled to the plate line, and a gate node thereof coupled to the word selecting line, a second MIS transistor having one of source/drain nodes thereof coupled to the second node of the latch, another one of the source/drain nodes thereof coupled to the plate line, and a gate node thereof coupled to the word selecting line, and a driver circuit configured to set the plate line to a first potential causing a current to flow in a first direction through the first MIS transistor in a first operation mode and to a second potential causing a current to flow in a second direction opposite the first direction through the first MIS transistor in a second operation mode, the first operation mode causing a lingering change in characteristics of the first MIS transistor.

According to another aspect of the present invention, a semiconductor memory device includes a driver circuit, word lines extending from the driver circuit, plate lines extending from the driver circuit, word selecting lines extending from the driver circuit, a plurality of memory units arranged in a matrix, one of the memory units coupled to a first bit line and a second bit line, the one of the memory units including a latch having a first node and a second node configured to be bi-stable with a potential of the first node inverse to a potential of the second node, a first MIS transistor having one of source/drain nodes thereof coupled to the first node of the latch, another one of the source/drain nodes thereof coupled to one of the plate lines, and a gate node thereof coupled to one of the word selecting lines, a second MIS transistor having one of source/drain nodes thereof coupled to the second node of the latch, another one of the source/drain nodes thereof coupled to the one of the plate lines, and a gate node thereof coupled to the one of the word selecting lines, a third transistor having a gate thereof coupled to one of the word lines and source/drain nodes thereof coupled to the first node and the first bit line, respectively, and a fourth transistor having a gate thereof coupled to the one of the word lines and source/drain nodes thereof coupled to the second node and the second bit line, respectively, wherein the driver circuit is configured to set the plate line to a first potential causing a current to flow in a first direction through the first MIS transistor in a first operation mode and to a second potential causing a current to flow in a second direction opposite the first direction through the first MIS transistor in a second operation mode, the first operation mode causing a lingering change in characteristics of the first MIS transistor.

According to another aspect of the present invention, a method of writing and reading data to and from a memory cell is provided. The memory cell includes a latch having a first node and a second node configured to be bi-stable with a potential of the first node inverse to a potential of the second node, a plate line, a word selecting line, a first MIS transistor having one of source/drain nodes thereof coupled to the first node of the latch, another one of the source/drain nodes thereof coupled to the plate line, and a gate node thereof coupled to the word selecting line, and a second MIS transistor having one of source/drain nodes thereof coupled to the second node of the latch, another one of the source/drain nodes thereof coupled to the plate line, and a gate node thereof coupled to the word selecting line. The method includes a first step of causing a current to flow in a first direction through the first MIS transistor, thereby causing a lingering change in characteristics of the first MIS transistor, and a second step of causing a current to flow in a second direction opposite the first direction through the first MIS transistor, thereby causing said latch to store data responsive to the lingering change in characteristics of said first MIS transistor.

According to at least one embodiment of the present invention, with the reversal of the source and drain nodes between the time of data write operation (first operation mode) and the time of data read operation (second operation mode), a change in the transistor characteristics caused by a hot-carrier effect is efficiently used as a means to store data.

BRIEF DESCRIPTION OF THE DRAWINGS

Other objects and further features of the present invention will be apparent from the following detailed description when read in conjunction with the accompanying drawings, in which:

FIG. 3 is a drawing for explaining the data read operation of the memory cell shown in FIG. 1;

FIGS. 4A and 4B are illustrative drawings for explaining localization of a hot-carrier effect;

DESCRIPTION OF THE PREFERRED EMBODIMENTS

In the following, embodiments of the present invention will be described with reference to the accompanying drawings.

Figure 1:
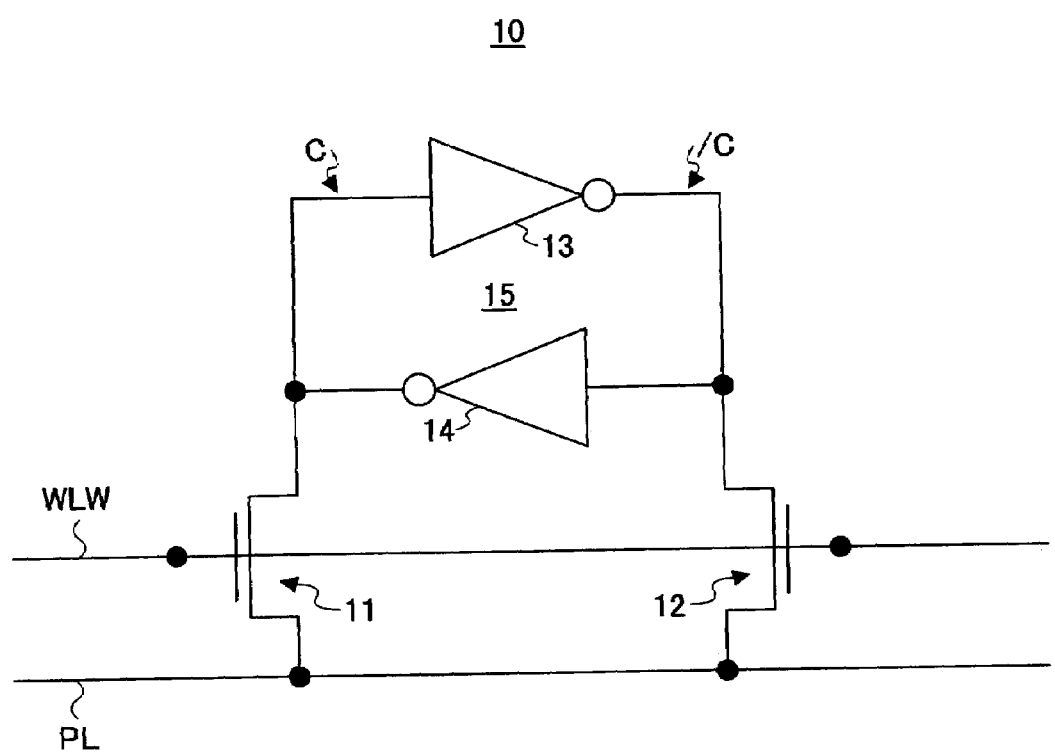
FIG. 1 is a circuit diagram showing a first embodiment of a nonvolatile semiconductor memory circuit according to the present invention.

FIG. 1 is a circuit diagram showing a first embodiment of a nonvolatile semiconductor memory circuit according to the present invention. In FIG. 1, the nonvolatile memory cell according to the present invention is comprised of n-channel silicon MOS transistors as a non-limiting example. Other transistors such as p-channel silicon MOS transistors may as well be used to form the nonvolatile memory cell according to the present invention.

A memory cell (i.e., a basic unit of data storage) 10 shown in FIG. 1 includes an NMOS transistor 11, an NMOS transistor 12, and inverters 13 and 14. The gate node of the NMOS transistor 11 and the gate node of the NMOS transistor 12 are coupled to a word selecting line WLW. One of the source/drain nodes of the NMOS transistor 11 is coupled to a plate line PL, and the other is coupled to an electrical node C. One of the source/drain nodes of the NMOS transistor 12 is coupled to the plate line PL, and the other is coupled to an electrical node /C (the symbol "/" preceding another symbol indicates an inverse of the latter symbol). Each of the inverters 13 and 14 has the output thereof coupled to the input of one another, thereby forming a latch (flip-flop circuit) 15. The electrical node C and electrical node /C of the flip-flop circuit 15 have respective bi-stable potentials that are inverse to each other.

The NMOS transistor 11 and NMOS transistor 12 are conventional MIS (metal-insulating film-semiconductor) transistors. The NMOS transistor 11 and NMOS transistor 12 are designed such as to operate with a power supply voltage of 1.8 V, for example. Namely, when these transistors are driven with a voltage no greater than 1.8 V, a change in the characteristics due to a hot-carrier effect does not occur from a practical point of view.

Figure 2:
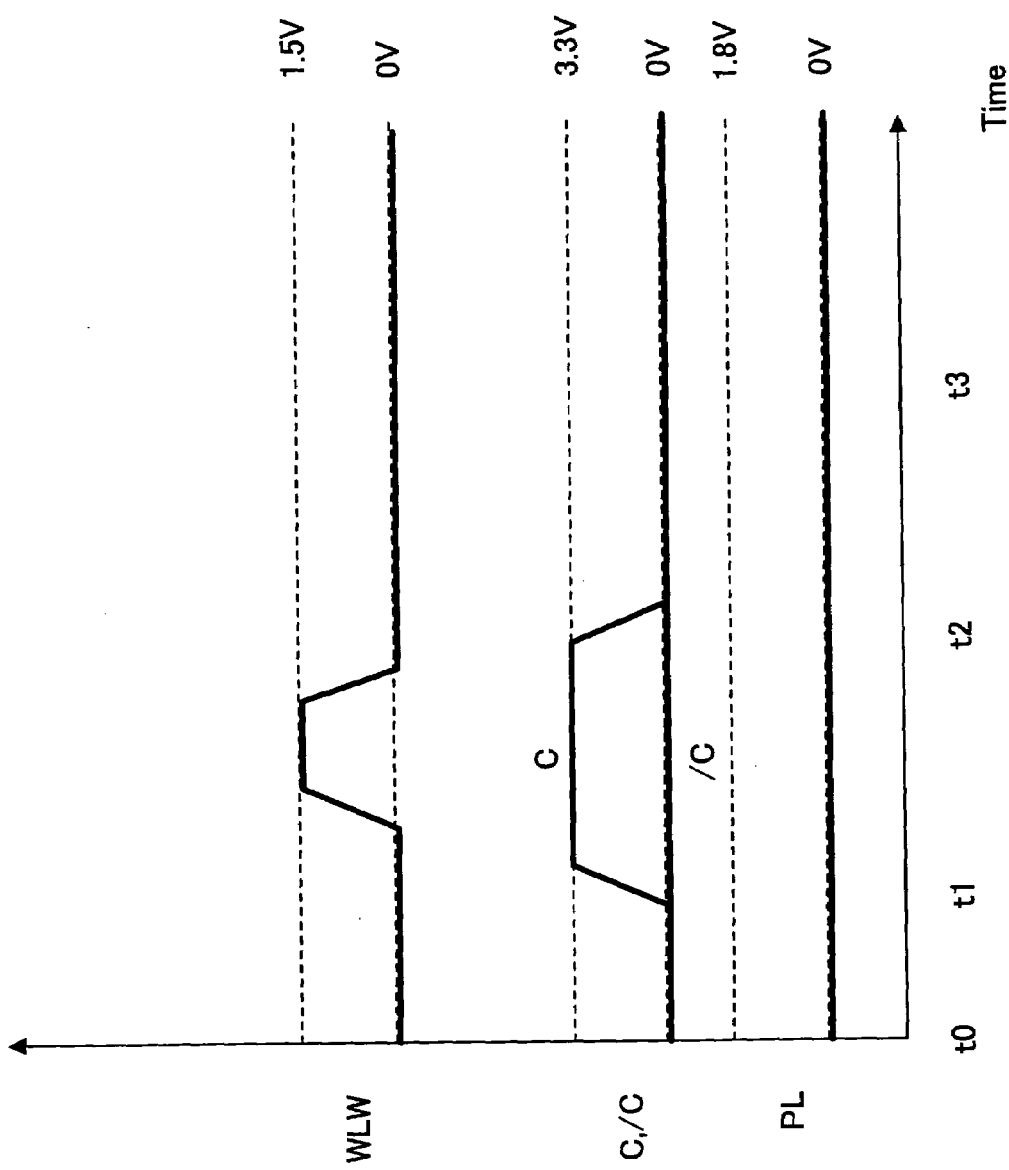
FIG. 2 is a drawing for explaining the data write operation of the memory cell shown in FIG. 1.

FIG. 2 is a drawing for explaining the data write operation of the memory cell 10 shown in FIG. 1. With reference to FIG. 2, the data write operation of the memory cell 10 will be described in the following.

The electrical nodes C and /C of the flip-flop circuit 15 are set to respective potentials that are inverse to each other. In an example shown in FIG. 2, the electrical node C is set to 3.3 V, and the electrical node /C is set to 0 V, for example. In order to create this potential state, these potentials may be applied to the electrical nodes C and /C from an exterior. Alternatively, these potentials may reflect the data stored in the flip-flop circuit 15.

After the electrical nodes C and /C are set to the respective potentials as described above, the word selecting line WLW is set to 1.5 V, for example. The potential of the word selecting line WLW is determined such as to maximize the effect of a hot-carrier phenomenon. Generally, such potential is selected to be half the voltage between the source node and drain node of the transistor that is subjected to a hot-carrier effect. The potential of the plate line PL is set to 0 V, for example, before the potential of the word selecting line WLW is raised.

In FIG. 2, a voltage of 3.3 V between the electrical node C and the plate line PL is applied between the drain node and source node of the NMOS transistor 11 while the electrical node C is maintained at 3.3 V. Further, a voltage of 1.5 V between the word selecting line WLW and the plate line PL is applied between the gate node and source node of the NMOS transistor 11. Since these bias voltages are larger than the voltages used in routine operations, the NMOS transistor 11 experiences a strong hot-carrier effect. Specifically, the application of the bias voltages for duration of 0.1 second to 1 second serves to generate a change in the characteristics that is substantially larger than the normal variation of the transistor characteristics. For example, the threshold voltage of the NMOS transistor 11 rises a few tens of millivolts. In other words, the channel resistance decreases approximately by 10%.

It should be noted that such a change in the transistor characteristics caused by a hot-carrier effect is localized around the drain node of the NMOS transistor 11, i.e., around the node of the NMOS transistor 11 that is coupled to the electrical node C.

In the example described above, only the NMOS transistor 11 experiences a hot-carrier effect. The NMOS transistor 12 does not experience a hot-carrier effect because its drain node and source node are both set to 0 V.

If the potentials of the electrical nodes C and /C are reversed, with C being set to 0 V and /C being set to 3.3 V, the NMOS transistor 11 having 0 V applied to the drain node and source node thereof does not experience a hot-carrier effect. There is thus no lingering change in the transistor characteristics of the NMOS transistor 11. On the other hand, the NMOS transistor 12 experiences a hot-carrier effect.

The hot-carrier effect as described above leaves an irreversible lingering change in the transistor characteristics. Changes in the characteristics of the NMOS transistor 11 and NMOS transistor 12 caused by the hot-carrier effect thus achieve a nonvolatile data retention that reflects the initial potential settings of the electrical nodes C and /C.

FIG. 3 is a drawing for explaining the data read operation of the memory cell 10 shown in FIG. 1. With reference to FIG. 3, the data read operation of the memory cell 10 will be described in the following.

In order to read the data from the NMOS transistor 11 and the NMOS transistor 12, the flip-flop circuit 15 comprised the inverters 13 and 14 is switched from an electrically inactive state to an electrically active state. This may be achieved by shifting the power supply voltage VDD applied to the inverters 13 and 14 from 0 V to 1.8 V as shown in FIG. 3. The potentials of the plate line PL and the word selecting line WLW are set to 1.8 V and 0 V, respectively, before the flip-flop circuit 15 is activated.

In a first case, the NMOS transistor 11 has a lingering change in the characteristics due to a hot-carrier effect (such as an increase in the threshold voltage or a decrease in the ON current), whereas the NMOS transistor 12 does not have such a lingering change in the characteristics. In this case, the force that pulls up the electrical node C is weaker than the force that pulls up the electrical node /C. After the activation of the flip-flop circuit 15, therefore, the electrical node C is set to the LOW level, and the electrical node /C is set to the HIGH level.

In a second case, the NMOS transistor 12 has a lingering change in the characteristics due to a hot-carrier effect (such as an increase in the threshold voltage or a decrease in the ON current), whereas the NMOS transistor 11 does not have such a lingering change in the characteristics. In this case, the force that pulls up the electrical node C is stronger than the force that pulls up the electrical node /C. After the activation of the flip-flop circuit 15, therefore, the electrical node C is set to the HIGH level, and the electrical node /C is set to the LOW level.

In this manner, the configuration shown in FIG. 1 can detect and sense the data stored through a hot-carrier effect. It should be noted, however, that the HIGH/LOW levels of the electrical nodes C and /C are reversed between when the data is written and when the data is read. Because of this, there is a need to invert the data at the time of data writing or at the time of data reading.

In the present invention as described above, the drain node and source node used to apply a bias for generating a hot-carrier effect are reversed and used as a source node and a drain node at the time of reading the data. When the NMOS transistor 11 is subjected to a hot-carrier effect on purpose, the electrical node C is set to HIGH (3.3 V), and the plate line PL is set to LOW (0 V). This means that the node of the NMOS transistor 11 connected to the electrical node C serves as a drain node at the time of data writing, with the opposite node serving as a source node. When the data is read, on the other hand, the plate line PL is set to HIGH (1.8 V) whereas the electrical node C is initially placed at LOW (0 V). This means that the node of the NMOS transistor 11 connected to the electrical node C serves as a source node at the time of data writing, with the opposite node serving as a drain node.

With the reversal of the source and drain nodes between the time of data write operation and the time of data read operation, a change in the transistor characteristics caused by a hot-carrier effect is efficiently used as a means to store data. FIGS. 4A and 4B are illustrative drawings for explaining localization of a hot-carrier effect.

FIG. 4A illustrates accumulation of electric charge at the time of data writing. FIG. 4A shows a source node 21, a drain node 22, a gate node 23, a gate insulating film 24, accumulated electric charge 25, and a channel 26. At the time of data wiring, the drain node 22 is set to HIGH, and the source node 21 is set to LOW. The electric field in the channel 26 becomes stronger towards the drain node 22, and a larger number of hot carriers are generated near the drain node 22 than near the source node 21. Because of this, the accumulation of electric charge in the gate insulating film 24 mainly occurs in the proximity of the drain node 22. The position of the accumulated electric charge 25 illustrates such localized accumulation.

FIG. 4B illustrates the position of the channel 26 at the time of data reading. When the source node and drain node are reversed from the time of data writing, the accumulated electric charge 25 is situated near the source node 21. The closer the accumulated electric charge 25 to the source node 21, the stronger the effect of the accumulated electric charge 25 is felt.

Figure 5:
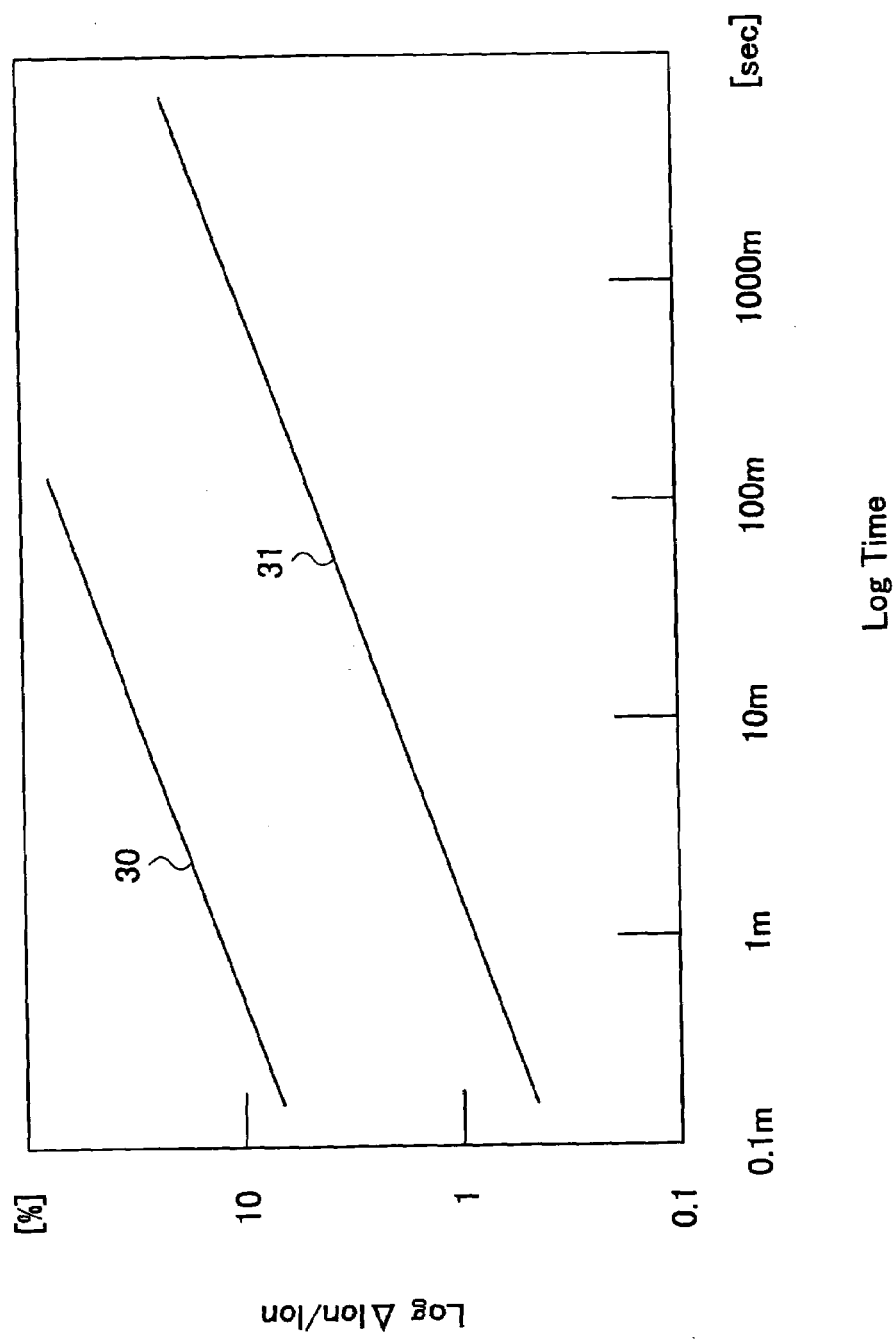
FIG. 5 is a diagram showing the relationship between the time spent on the writing of data and changes in an ON current.

FIG. 5 is a diagram showing the relationship between the time spent on the writing of data and changes in the ON current. In FIG. 5, the horizontal axis represents a logarithm of the length of a time that is spent writing data, and the vertical axis represents a logarithm of a percentile change in the ON current. A characteristic line 30 indicates a case in which the source and drain nodes are reversed between data writing and data reading. A characteristic line 31 indicates a case in which the source and drain nodes are not reversed between data writing and data reading.

A change in the transistor characteristics caused by a hot-carrier approximately corresponds to the length of the write time to the 0.3 power. Without reversing the source and drain nodes of the MOS transistor that stores data by a hot-carrier effect, a change of 30 mV in the threshold voltage may require 30 minutes of data writing. In this case, the reversal of the source and drain nodes of the MOS transistor makes it possible to generate the same amount of change (30 mV in the threshold voltage) with only 2 seconds of data writing. That is, it is possible to reduce the length of time required for data writing by a factor of 1/1000.

Figure 6:
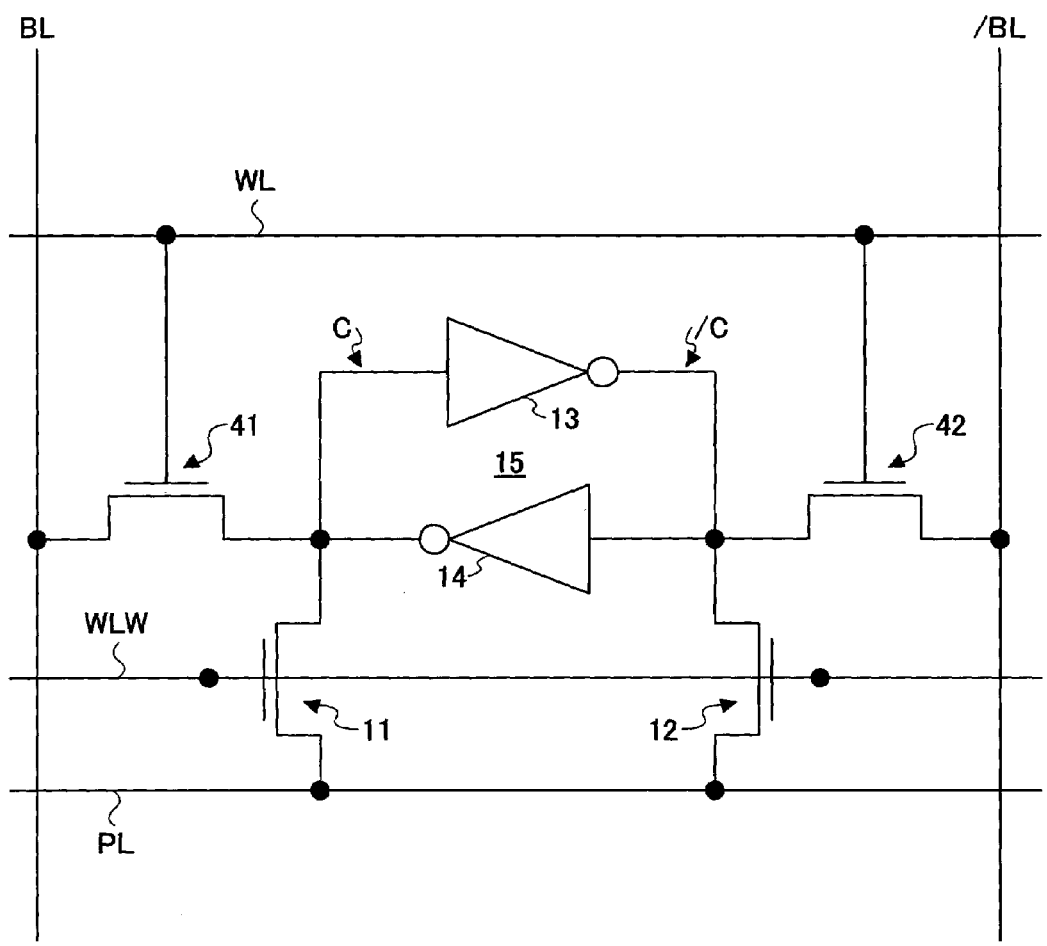
FIG. 6 is a circuit diagram showing a second embodiment of the nonvolatile semiconductor memory circuit according to the present invention.

FIG. 6 is a circuit diagram showing a second embodiment of the nonvolatile semiconductor memory circuit according to the present invention. In FIG. 6, the same elements as those of FIG. 1 are referred to by the same numerals, and a description thereof will be omitted.

Compared with the configuration shown in FIG. 1, FIG. 6 illustrates the memory cell 10 together with surrounding circuit elements, which include bit lines BL and /BL, a word line WL, and NMOS transistors 41 and 42. The NMOS transistor 41 provides a coupling between the electrical node C and the bit line BL. The NMOS transistor 42 provides a coupling between the electrical node /C and the bit line /BL. With this provision, it is possible to control the inputting/outputting of data into/from the flip-flop circuit 15 through the NMOS transistors 41 and 42.

When the word line WL is activated to HIGH, the NMOS transistors 41 and 42 become conductive. The data stored in the flip-flop circuit 15 is thus read to the bit lines BL and /BL. If the bit lines BL and /BL are externally forced to respective potentials, on the other hand, the data represented by the bit line potentials is stored in the flip-flop circuit 15 through the NMOS transistors 41 and 42.

Figure 7:
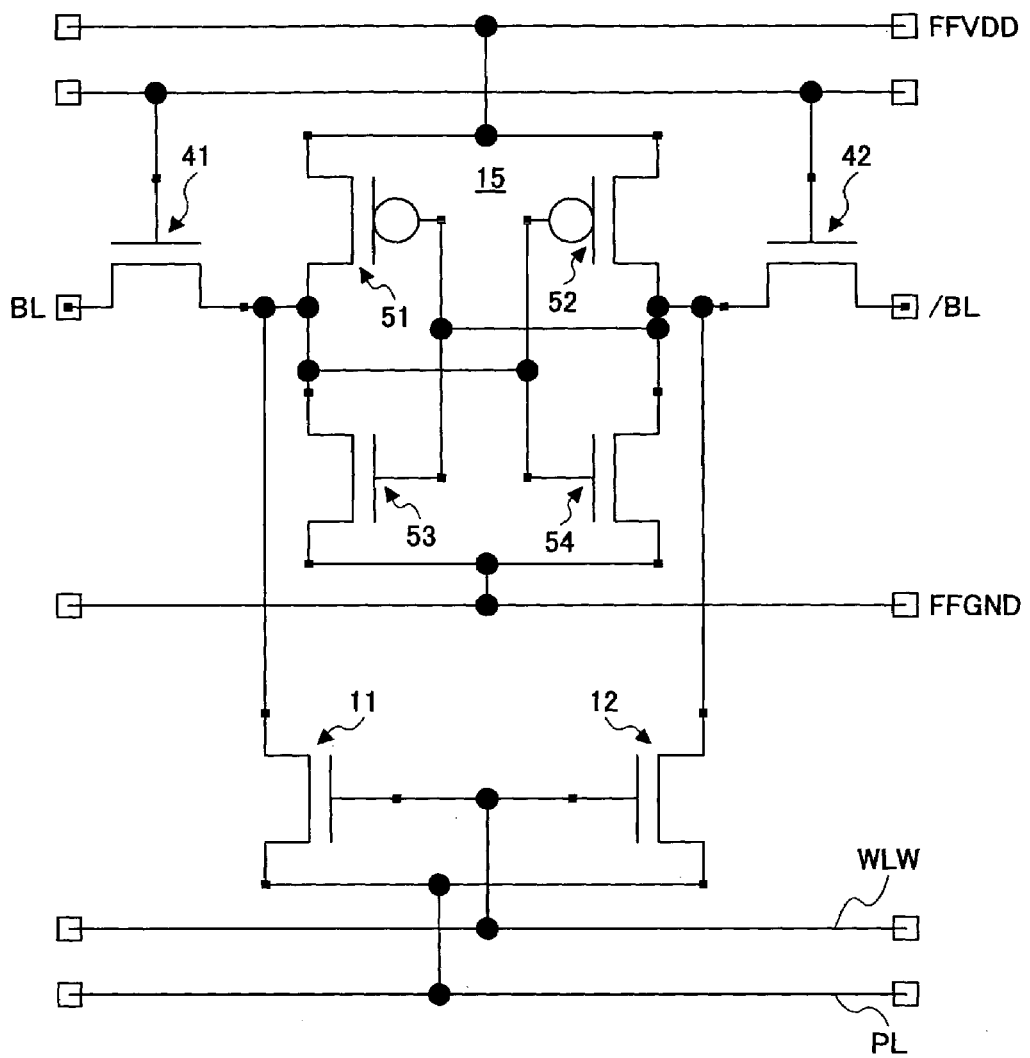
FIG. 7 is a circuit diagram showing a detailed configuration of the circuit shown in FIG. 6.

FIG. 7 is a circuit diagram showing a detailed configuration of the circuit shown in FIG. 6. In FIG. 7, the same elements as those of FIG. 6 are referred to by the same numerals, and a description thereof will be omitted.

In FIG. 7, the flip-flop circuit 15 includes PMOS transistors 51 and 52 and NMOS transistors 53 and 54. The PMOS transistor 51 and the NMOS transistor 53 form a first inverter (corresponding to the inverter 14 in FIG. 6), and the PMOS transistor 52 and the NMOS transistor 54 form a second inverter (corresponding to the inverter 13 in FIG. 6). The flip-flop circuit 15 receives a power supply voltage FFVDD and a ground voltage FFGND. Setting the power supply voltage FFVDD to HIGH and the ground voltage FFGND to LOW places the flip-flop circuit 15 in an activated state. Setting the power supply voltage FFVDD to LOW and the ground voltage FFGND to LOW places the flip-flop circuit 15 in a deactivated state. In this manner, the activation/deactivation of the flip-flop circuit 15 is readily controlled by manipulating the the power supply voltage FFVDD and the ground voltage FFGND. Such control is necessary in order to read data from the NMOS transistors 11 and 12 as described in connection with FIG. 3. Further, setting the power supply voltage FFVDD to 3.3 V and the ground voltage FFGND to 0 V makes it possible to set one of the electrical nodes C and /C to 3.3 V and the other to 0 V. Such control may be useful for the purpose of transferring the data stored in the flip-flop circuit 15 to the NMOS transistors 11 and 12 for storage as nonvolatile data.

Figure 8:
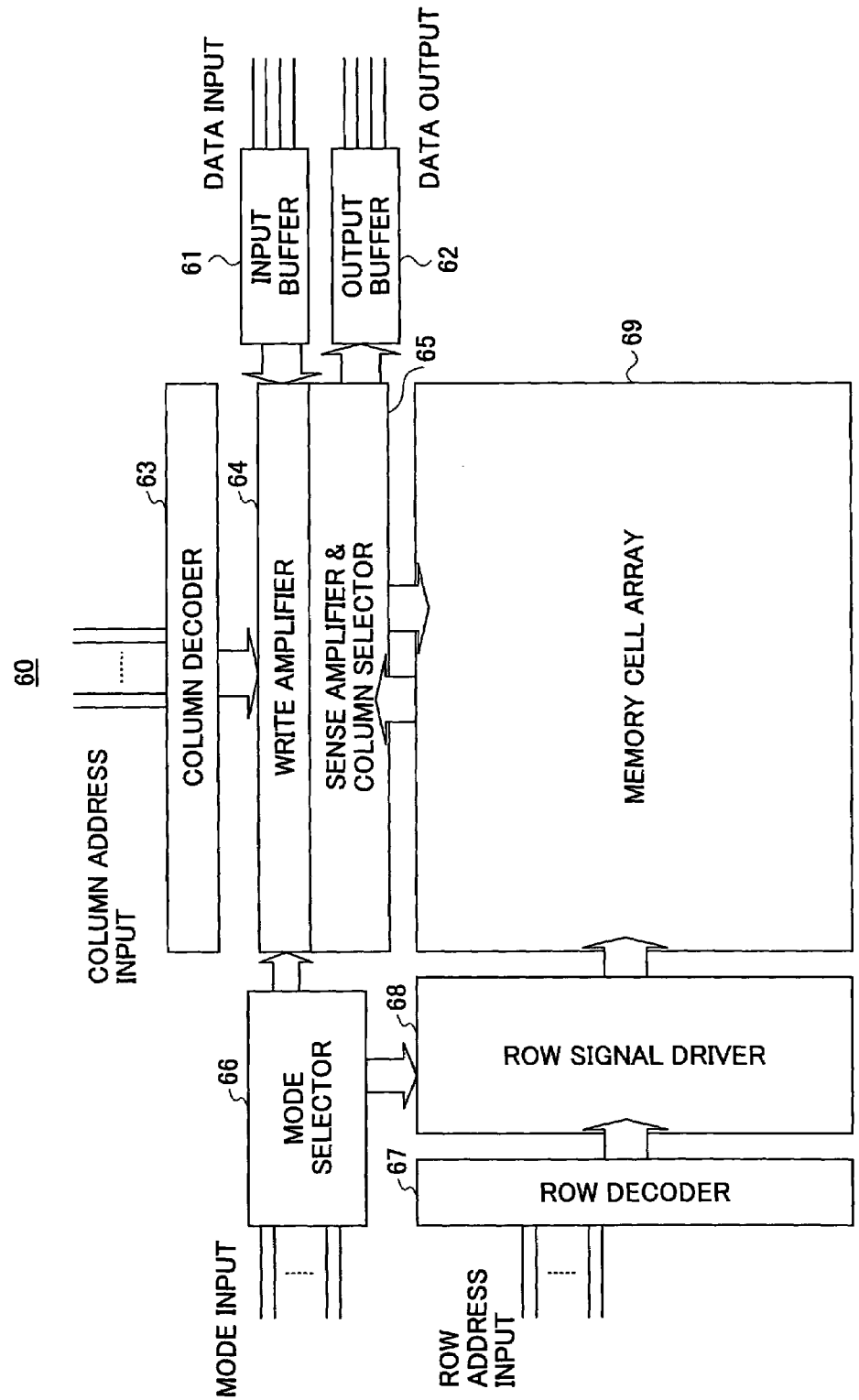
FIG. 8 is a block diagram showing the configuration of a nonvolatile semiconductor memory device according to the present invention.

FIG. 8 is a block diagram showing the configuration of a nonvolatile semiconductor memory device according to the present invention. A semiconductor memory device 60 shown in FIG. 8 includes an input buffer 61, an output buffer 62, a column decoder 63, a write amplifier 64, a sense amplifier & column selector 65, a mode selector 66, a row decoder 67, a row signal driver 68, and a memory cell array 69.

The memory cell array 69 includes a plurality of memory cells arranged in a matrix form, each memory cell having a circuit configuration as shown in FIG. 7, for example. The memory cells arranged in the same column are connected to the same bit lines, and the memory cells arranged in the same row are connected to the same word line. The memory cells arranged in the same row may be connected to the same word selecting line WLW and the same plate line PL (see FIG. 7, for example), which is however not an essential feature of the present invention.

The mode selector 66 receives mode input signals from an exterior of the device, and decodes the mode input signal to determine an operation mode (e.g., a write operation mode or a read operation mode). Control signals responsive to the determined operation mode are supplied to the write amplifier 64, the sense amplifier & column selector 65, the row signal driver 68, etc., for control of the individual parts of the semiconductor memory device 60.

The column decoder 63 receives a column address input from the exterior of the device, and decodes the column address input to determine a selected column. The decode signals indicative of the selected column are supplied to the write amplifier 64 and the sense amplifier & column selector 65.

The row decoder 67 receives a row address input from the exterior of the device, and decodes the row address input to determine a selected row. The decode signals indicative of the selected row are supplied to the row signal driver 68.

In response to the control signals from the mode selector 66 and the decode signals from the row decoder 67, the row signal driver 68 activates a selected word line among the word lines extending from the row signal driver 68. As a result of the activation of the selected word line, the flip-flop circuit 15 (see FIG. 7) of each memory cell connected to the selected word line is coupled to a corresponding bit line pair among a plurality of bit line pairs. Through this coupling, the writing/reading of data to/from the flip-flop circuit 15 is performed.

In response to the control signals from the mode selector 66 and the decode signals from the column decoder 63, the sense amplifier & column selector 65 couples bit lines corresponding to the selected column to a data bus. Through this coupling, data is transferred between the memory cell array 69 and the data bus. The sense amplifier & column selector 65 amplifies the data read from the memory cell array 69 for provision to the output buffer 62. The data is output from the output buffer 62 to the exterior of the device as output data. Input data supplied to the input buffer 61 is provided to the write amplifier 64. The write amplifier 64 amplifies the input data to be written to the memory cell array 69.

Figure 9:
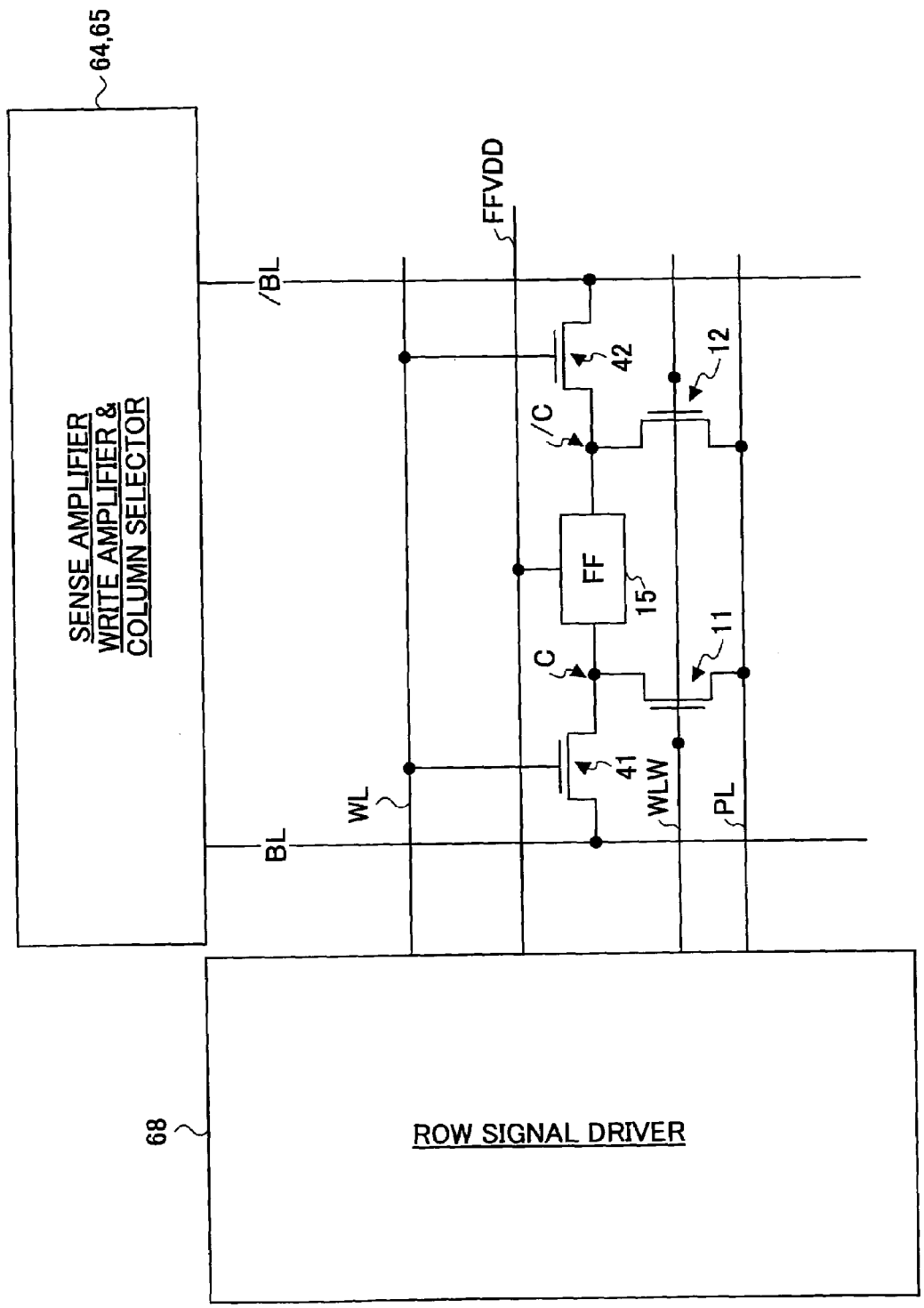
FIG. 9 is an illustrative drawing showing the connections between a memory cell and a write amplifier 64, a sense amplifier & column selector, and a row signal driver.

FIG. 9 is an illustrative drawing showing the connections between a memory cell and the write amplifier 64, the sense amplifier & column selector 65, and the row signal driver 68. As shown in FIG. 9, the bit lines BL and /BL extend from the write amplifier 64 and the sense amplifier & column selector 65, and are coupled to a memory cell (comprised of the NMOS transistors 11 and 12 and the flip-flop circuit 15) via the NMOS transistors 41 and 42. The word selecting line WLW and the plate line PL extend from the row signal driver 68, and are coupled to the memory cell. The word line WL extends from the row signal driver 68 to be connected to the gate of the NMOS transistors 41 and 42. Further, a power supply line for supplying the voltage FFVDD (see FIG. 7) may extend from the row signal driver 68 to be connected to the flip-flop circuit 15.

It should be noted that the configuration shown in FIG. 9 is identical with respect to each and every one of the memory cells provided in the memory cell array 69. Namely, a plurality of word lines, a plurality of word selecting lines, a plurality of plate lines, and a plurality of power supply lines run in parallel in the memory cell array 69, and are connected to the corresponding memory cells.

When data is written to or read from the flip-flop circuit 15, the row signal driver 68 activates the word line WL to couple the flip-flop circuit 15 to the bit lines BL and /BL. In the case of a data write operation, the bit lines BL and /BL are set to respective potentials by the write amplifier 64, so that the data corresponding to the bit line potentials is written to the flip-flop circuit 15. In the case of a data read operation, data potentials appearing on the bit lines BL and /BL in response to the data stored in the flip-flop circuit 15 are amplified by the sense amplifier & column selector 65 for provision to the exterior of the device as output data.

If there is a need to store the data of the flip-flop circuit 15 in a nonvolatile manner, the row signal driver 68 sets the word selecting line WLW to 1.5 V and the plate line PL to 0 V, as shown in FIG. 2. Further, the row signal driver 68 may set the power supply potential FFVDD to 3.3 V, so that the flip-flop circuit 15 is driven with 3.3 V, resulting in one of the electrical nodes C and /C being set to 3.3 V and the other being set to 0 V. This causes the NMOS transistor 11 or the NMOS transistor 12 to experience a hot-carrier effect, whichever is selected according to the data stored in the flip-flop circuit 15.

If there is a need to read the data stored in the NMOS transistors 11 and 12, the flip-flop circuit 15 is switched from an electrically inactive state to an electrically active state. This may be achieved by shifting the power supply voltage FFVDD applied to the flip-flop circuit 15 from 0 V to 1.8 V. Further, the row signal driver 68 sets the potentials of the plate line PL and the word selecting line WLW to 1.8 V and 0 V, respectively, before the flip-flop circuit 15 is activated.

Figure 10:
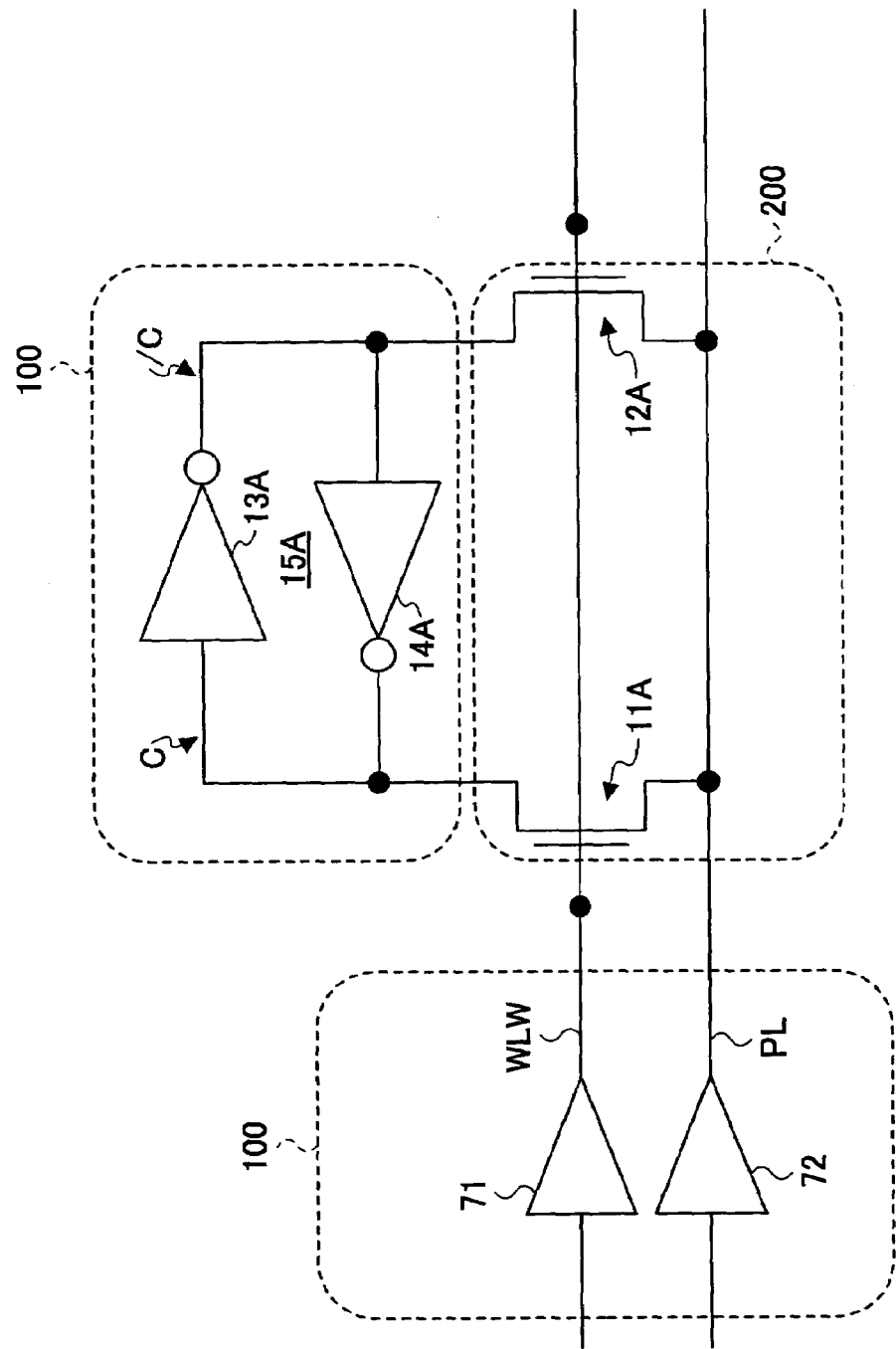
FIG. 10 is a circuit diagram showing a third embodiment of a nonvolatile semiconductor memory circuit according to the present invention.

FIG. 10 is a circuit diagram showing a third embodiment of a nonvolatile semiconductor memory circuit according to the present invention.

A memory cell shown in FIG. 10 includes an NMOS transistor 11A, an NMOS transistor 12A, and inverters 13A and 14A. The gate node of the NMOS transistor 11A and the gate node of the NMOS transistor 12A are coupled to the word selecting line WLW extending from a word selecting line driver 71, which is part of the row signal driver 68 (see FIG. 9). One of the source/drain nodes of the NMOS transistor 11A is coupled to the plate line PL extending from a plate line driver 72, which is part of the row signal driver 68 (see FIG. 9), and one of the source/drain nodes of the NMOS transistor 12A is also coupled to the plate line PL.

The circuit configuration of the memory cell shown in FIG. 10 is the same as the circuit configuration of the memory cell 10 shown in FIG. 1. In the third embodiment shown in FIG. 10, however, transistors used for implementing the circuit elements are different from one circuit element to another. Specifically, circuit portions 100 are implemented by using transistors each designed to operate with a power supply voltage of 3.3 V, for example, and a circuit portion 200 is implemented by using transistors each designed to operate with a power supply voltage of 1.8V, for example. That is, the inverters 13A and 14A forming a flip-flop circuit 15A and the drivers 71 and 72 are formed with 3.3V transistors whereas the NMOS transistors 11 and 12 are 1.8V transistors.

With development in semiconductor process technology, the power supply voltage used for MOS transistors of a core circuit has been dropping. With the 0.18-micron process technology, the power supply voltage is generally 1.8V. With the 0.13-micron process technology, the power supply voltage is generally 1.2V. Irrespective of such voltage variation in the core circuit, some of the signals input/output into/from the device should conform to a certain standard, which requires a constant signal voltage level. Because of this, most devices are provided with 3.3V I/O transistors for the purpose of using 3.3V signals for communication with the exterior.

In the third embodiment shown in FIG. 10, the NMOS transistors 11A and 12A are those operating with a reduced power supply voltage while the transistors of the inverters 13A and 14A are equivalent to the 3.3V I/O transistors, for example. Such difference in the operating voltage (power supply voltage) is achieved by changing the size of transistors, for example.

With this provision, the use of the 3.3V operating voltage brings about a hot-carrier effect in the NMOS transistors 11A and 12A to generate a desired change in the transistor characteristics. The use of such an increased operating voltage helps to shorten the time length required for the writing of data. Further, since the inverters 13A and 14A are made of the transistors equivalent to the 3.3V I/O transistors, the use of the 3.3V operating voltage does not cause any undesired change in the characteristics of these transistors.

Further, the present invention is not limited to these embodiments, but various variations and modifications may be made without departing from the scope of the present invention.

What is claimed is:

1. A memory circuit, comprising:
   a latch having a first node and a second node configured to be bi-stable with a potential of the first node inverse to a potential of the second node;
   a plate line;
   a word selecting line;
   a first MIS transistor having one of source/drain nodes thereof coupled to the first node of said latch, another one of the source/drain nodes thereof coupled to said plate line, and a gate node thereof coupled to said word selecting line;
   a second MIS transistor having one of source/drain nodes thereof coupled to the second node of said latch, another one of the source/drain nodes thereof coupled to said plate line, and a gate node thereof coupled to said word selecting line; and
   a driver circuit configured to set said plate line to a first potential causing a current to flow in a first direction through said first MIS transistor in a first operation mode and to a second potential causing a current to flow in a second direction opposite the first direction through said first MIS transistor in a second operation mode, said first operation mode causing a lingering change in characteristics of said first MIS transistor.

2. The memory circuit as claimed in claim 1, wherein said second operation mode causes said latch to store data responsive to the lingering change in the characteristics of said first MIS transistor.

3. The memory circuit as claimed in claim 1, wherein said first node is at a third potential higher than a potential of said second node in the first operation mode, and the first potential of said plate line is lower than the third potential.

4. The memory circuit as claimed in claim 3, wherein said driver circuit sets, in the first operation mode, said word selecting line to a potential that is situated between the first potential and the third potential.

5. The memory circuit as claimed in claim 4, wherein the third potential is higher than a normal operating potential of said first MIS transistor.

6. The memory circuit as claimed in claim 1, further comprising a power supply line coupled between said driver circuit and said latch, said driver circuit being configured to control activation and deactivation of said latch through said power supply line.

7. The memory circuit as claimed in claim 6, wherein said driver circuit is configured to control an operating voltage of said latch through said power supply line.

8. The memory circuit as claimed in claim 6, wherein said driver circuit is configured to deactivate said latch such as to set the first node and second node to a common potential at a first stage of the second operation mode, and is configured to activate said latch and set said plate line to the second potential at a second stage of the second operation mode, thereby causing said latch to store data responsive to the lingering change in the characteristics of said first MIS transistor.

9. A semiconductor memory device, comprising:
  a driver circuit;
  word lines extending from said driver circuit;
  plate lines extending from said driver circuit;
  word selecting lines extending from said driver circuit;
  a plurality of memory units arranged in a matrix, one of said memory units coupled to a first bit line and a second bit line, said one of said memory units including:
  a latch having a first node and a second node configured to be bi-stable with a potential of the first node inverse to a potential of the second node;
  a first MIS transistor having one of source/drain nodes thereof coupled to the first node of said latch, another one of the source/drain nodes thereof coupled to one of said plate lines, and a gate node thereof coupled to one of said word selecting lines;
  a second MIS transistor having one of source/drain nodes thereof coupled to the second node of said latch, another one of the source/drain nodes thereof coupled to said one of said plate lines, and a gate node thereof coupled to said one of said word selecting lines;
  a third transistor having a gate thereof coupled to one of said word lines and source/drain nodes thereof coupled to the first node and the first bit line, respectively; and
  a fourth transistor having a gate thereof coupled to said one of said word lines and source/drain nodes thereof coupled to the second node and the second bit line, respectively,
  wherein said driver circuit is configured to set said plate line to a first potential causing a current to flow in a first direction through said first MIS transistor in a first operation mode and to a second potential causing a current to flow in a second direction opposite the first direction through said first MIS transistor in a second operation mode, said first operation mode causing a lingering change in characteristics of said first MIS transistor.

10. The semiconductor memory device as claimed in claim 9, wherein said second operation mode causes said latch to store data responsive to the lingering change in the characteristics of said first MIS transistor.

11. The semiconductor memory device as claimed in claim 9, wherein said first node is at a third potential higher than a potential of said second node in the first operation mode, and the first potential of said plate line is lower than the third potential.

12. The semiconductor memory device as claimed in claim 11, wherein said driver circuit sets, in the first operation mode, said word selecting line to a potential that is situated between the first potential and the third potential.

13. The semiconductor memory device as claimed in claim 12, wherein the third potential is higher than a normal operating potential of said first MIS transistor.

14. The semiconductor memory device as claimed in claim 9, further comprising a power supply line coupled between said driver circuit and said latch, said driver circuit being configured to control activation and deactivation of said latch through said power supply line.

15. The semiconductor memory device as claimed in claim 14, wherein said driver circuit is configured to control an operating voltage of said latch through said power supply line.

16. The semiconductor memory device as claimed in claim 14, wherein said driver circuit is configured to deactivate said latch such as to set the first node and second node to a common potential at a first stage of the second operation mode, and is configured to activate said latch and set said plate line to the second potential at a second stage of the second operation mode, thereby causing said latch to store data responsive to the lingering change in the characteristics of said first MIS transistor.

17. A method of writing and reading data to and from a memory cell, which includes a latch having a first node and a second node configured to be bi-stable with a potential of the first node inverse to a potential of the second node, a plate line, a word selecting line, a first MIS transistor having one of source/drain nodes thereof coupled to the first node of said latch, another one of the source/drain nodes thereof coupled to said plate line, and a gate node thereof coupled to said word selecting line, and a second MIS transistor having one of source/drain nodes thereof coupled to the second node of said latch, another one of the source/drain nodes thereof coupled to said plate line, and a gate node thereof coupled to said word selecting line, said method comprising:
  a first step of causing a current to flow in a first direction through said first MIS transistor, thereby causing a lingering change in characteristics of said first MIS transistor, wherein said first step includes a step of setting the plate line to a first potential; and
  a second step of causing a current to flow in a second direction opposite the first direction through said first MIS transistor, thereby causing said latch to store data responsive to the lingering change in characteristics of said first MIS transistor, wherein said second step includes a step of setting the late line to a second potential different from the first potential.

18. The method as claimed in claim 17, wherein said second step further includes:
  deactivating said latch such as to set the first node and second node to a common potential; and
  activating said latch after the plate line is set to the second potential.

* * * * *